United States Patent [19]

Allen et al.

[11] Patent Number: 4,665,426
[45] Date of Patent: May 12, 1987

[54] EPROM WITH ULTRAVIOLET RADIATION TRANSPARENT SILICON NITRIDE PASSIVATION LAYER

[75] Inventors: Bert L. Allen, Los Altos; A. Rahim Forouhi, San Jose, both of Calif.

[73] Assignee: Advanced Micro Devices, Inc., Sunnyvale, Calif.

[21] Appl. No.: 697,364

[22] Filed: Feb. 1, 1985

[51] Int. Cl.⁴ .................. H01L 29/78; H01L 29/06
[52] U.S. Cl. .................. 357/54; 357/23.5; 357/52
[58] Field of Search .......... 357/23.5, 52, 54; 365/185

[56] References Cited

U.S. PATENT DOCUMENTS

| | | |
|---|---|---|
| 3,660,819 | 8/1972 | Frohman-Bentchkowsky .................. 357/23.5 |
| 4,203,158 | 8/1980 | Frohman-Bentchkowsky ... 365/185 |
| 4,448,400 | 8/1984 | Harari .................. 365/185 |
| 4,516,313 | 8/1985 | Turi et al. .................. 357/54 |
| 4,532,022 | 7/1985 | Takasaki et al. .................. 357/52 |

OTHER PUBLICATIONS

T. E. Nagy et al., "Physical and electrical properties of plasma deposited silicon nitride films"m ECS Proceedings of the Symposium on *Silicon Nitride thin Insulating Films,* vol. 83-8 (1983) pp. 167-176.

M. J. Rand et al., "Optical absorption as a control test for plasma silicon nitride deposition", *Journal of the Electrochemical Society,* vol. 125 (1978) pp. 99-101.

*Primary Examiner*—J. Carroll
*Attorney, Agent, or Firm*—Patrick T. King; Eugene H. Valet

[57] ABSTRACT

An erasable programmable read only memory (EPROM) integrated circuit device 2 having a topside passivation layer 9 of silicon nitride which is transparent to ultraviolet radiation is disclosed. The refractive index of the silicon nitride film is in the range of 1.93±0.03.

8 Claims, 2 Drawing Figures

EPROM WITH ULTRAVIOLET RADIATION TRANSPARENT SILICON NITRIDE PASSIVATION LAYER

FIELD OF THE INVENTION

Cross-Reference To Related, Copending Application

Related, copending application of particular interest to the instant application is U.S. Ser. No. 684,516, entitled METHOD OF FORMING A SILICON NITRIDE FILM TRANSPARENT TO UNTRAVIOLET RADIATION, filed Dec. 21, 1984, on behalf of the same inventors herein, now U.S. Pat. No. 4,618,541, and assigned to the common assignee of the instant application.

The present invention generally relates to erasable programmable read only memory (EPROM) integrated circuits, and more particularly, to an EPROM device having a topside layer of silicon nitride which is transparent to ultraviolet light.

BACKGROUND OF THE INVENTION

In the construction of semiconductor integrated circuits, several types of topside layers are currently in use. This topside, "passivation", layer is used as a dielectric barrier to protect the underlying structure of the integrated circuit from both moisture and contaminants, which can cause corrosion or electric shorts.

In the early development of memory-type integrated circuits, a need became apparent for reprogrammable cells to accommodate project and program development during which specifications and performance criteria often change. This need has been largely supplied by the ultraviolet (UV) radiation erasable programmable read only memory (EPROM) integrated circuit.

Basically, the erase feature is activated and accomplished by shining ultraviolet light onto the semiconductor chip. The impinging radiation excites the electrons trapped on a floating gate region of the circuit structure and causes the electrons to move off the floating gate.

In order to perform the erase function, the topside passivation layer of the integrated circuit obviously must be transparent to UV light to a degree sufficient to allow the energy levels of the trapped electrons to be raised to a state whereby they will diffuse off the gate.

It is known in the art to use a quartz window, or other UV transparent insulator material, as the topside layer of the package upon which the integrated circuit is mounted. However, quartz windows are relatively expensive; other UV transparent materials do not have the high resistance to moisture, hydrogen, and ionic contaminants that a silicon nitride topside, "passivation" layer provides. For example, EPROM devices are commonly manufactured having a UV transparent passivation layer of silicon dioxide mounted on a ceramic package having just such a thick quartz window. The passivation layer has the relatively poor barrier properties as discussed above. Such an EPROM generally has good reliability, but is expensive due to the costs of fabricating the ceramic/quartz packaging.

Another example are one-time programmable read only memory (ROM) integrated circuits, which are commonly manufactured with a UV transparent passivation layer, such as silicon dioxide or silicon oxynitride in order that they may be "blanked" before mounting in a plastic package without a quartz window. Such devices are inexpensive but have relatively poor reliability because of the inadequate barrier properties.

On the contrary, an EPROM device with a silicon nitride passivation layer (exhibiting the superior barrier properties as discussed above) can be packaged in plastic without a quartz window, providing an inexpensive part having excellent reliability.

Moreover, it had been generally accepted that silicon nitride is opaque to UV light and, therefore, unsuitable for EPROM device applications. See e.g., MLS-883C.

Hence, it is an object of the present invention to provide an EPROM integrated circuit device having a passivation layer of silicon nitride which is transparent to UV light.

It is another object of the present invention to provide an EPROM integrated circuit having an improved passivation layer.

It is a further object of the present invention to provide an EPROM having a passivation layer with improved moisture and hydrogen resistance.

Yet a further object of the present invention is to provide an EPROM having a passivation layer which is less susceptible to ionic contamination problems.

SUMMARY OF THE INVENTION

The present inventin, in its broad aspect, provides an EPROM integrated circuit device having an improved topside passivation layer formed of silicon nitride which is transparent to ultraviolet radiation.

Generally, such a layer is fabricated in a reaction chamber designed for the deposition, particularly plasma enhanced deposition, of thin films. This technique is disclosed in detail in U.S. patent application Ser. No. 684,516, filed on Dec. 21, 1984 by the common assignee of the present invention.

Other objects, features, and advantages of the present invention will become apparent upon consideration of the following detailed description and the accompanying drawings, in which like reference designations represent like features throughout the Figures.

DETAILED DESCRIPTION OF THE INVENTION

Figure 1:
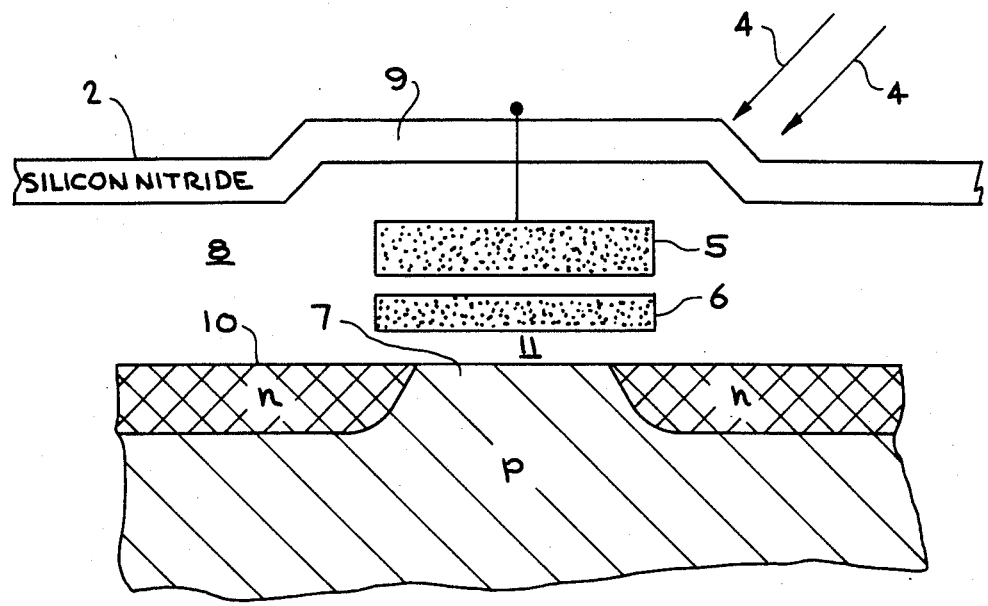
FIG. 1 is a schematic cutaway side-view of an individual EPROM cell basic embodiment of the present invention.

Briefly referring to FIG. 1, an exemplary embodiment of an EPROM structure is generally indicated at numeral 2. Various configurations of EPROM integrated circuit architectures are known in the art. Generally, the various configurations have a substrate 7, having active circuit components therein, an insulator layer 8, having control gate 5 and floating gate 6 therein, and a topside passivation layer 9, in common.

Figure 2:
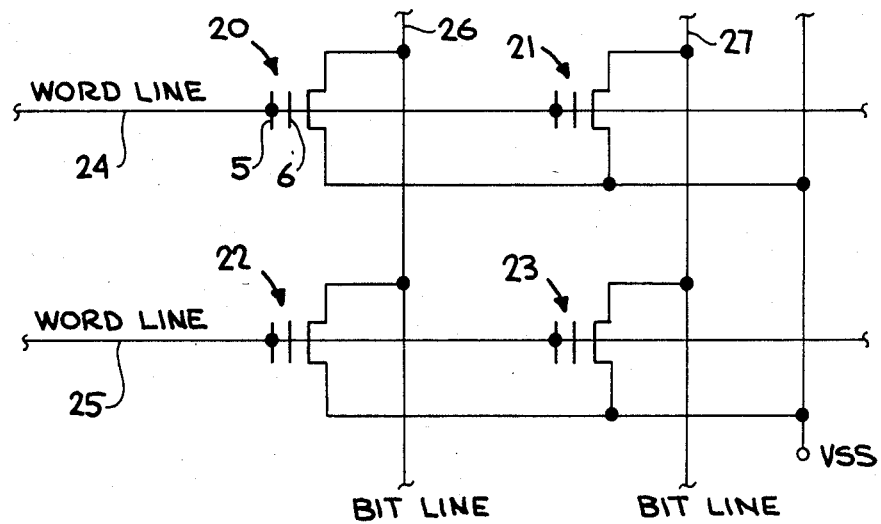
FIG. 2 is an electrical schematic diagram of an array of exemplary EPROM cells as is commonly used in accordance with the present invention of FIG. 1.

FIG. 2 shows an electrical schematic diagram illustrating a portion of an exemplary array of EPROM cells. Four individual EPROM cells, 20, 21, 22 and 23 are shown coupled to word lines 24, 25, and to bit lines 26, 27. As shown, each cell has a control gate 5 coupled to a word line and its other two electrodes coupled between the bit line and ground (VSS). For example, cell 22 is coupled to word line 25 and bit line 26.

The structure and operation of the individual memory cells, such as cells 20–23, are well known and have been the subject of many technical articles as well as patents. Briefly summarized, if the drain junction is driven to avalanche breakdown, high-energy electrons penetrate the gate oxide 11 and become trapped on a floating gate 6. The presence or absence of electrons on the floating gate 6 may be detected by application of suitable voltages to various combinations of a word line and bit line, a cell "address." In this manner, the contents of the floating gate 6 may represent a bit of information. Typical read voltages for the word line and bit line are 5 and 2 volts, respectively.

Another embodiment of an EPROM integrated circuit device is fully disclosed in U.S. patent application Ser. No. 607,337, filed on May 4, 1984 by the common assignee of the present invention, now abandoned.

Other EPROM integrated circuits are known in the art and are commercially available, such as the Am1700 series, Am2700 series, and the Am27000 series manufactured by Advanced Micro Devices, Inc., Sunyvale, Calif.

Incident UV light, shown as arrows 4 in FIG. 1, must excite the electrons trapped on the polysilicon floating gate 6 to an extent whereby they will then move off of the floating gate 6, and migrate across an insulator layer 8 to the control gate 5 and across gate oxide 11 to substrate 7, hence "erasing" the stored memory data bit. For UV light 4 to reach the gate 6 (either directly or as reflected by the boundary surface 10 of the substrate 7), the passivation layer 9 must be largely transparent to light in the ultraviolet wavelength at approximately 2537 Angstroms.

Silicon nitride is considered to be one of the best compositions for use as a passivation layer on semiconductor integrated circuits as a dielectric. It is known to have a high resistance to moisture and hydrogen penetration which would ruin the circuit. Moreover, diffusivity of various impurities, such as sodium, is much lower in silicon nitride than in other insulators, such as silicon dioxide. Thus, integrated circuits made with a silicon nitride passivation layer are less susceptible to ionic contamination problems.

A method of forming a silicon nitride film which is transparent to UV radiation is fully disclosed in co-pending U.S. patent application, Ser. No. 684,516, filed on Dec. 21, 1984 by the common assignee of the present invention. Said application is incorporated herein by reference in its entirety. In the main, it is disclosed therein that to be transparent to UV radiation, the silicon nitride passivation layer 9 must be formed such that silicon in excess of the level which exists in stoichiometrically pure silicon nitride is minimized. Regardless of the actual commercial plasma deposition system used to perform the method taught therein, the silane-to-ammonia ratio must be carefully adjusted and the temperature raised sufficiently to achieve said minimal excess silicon level. In one embodiment for example, the use of the commercially available AMS3300 system achieves the desired result by operating at 350 degrees Centigrade with a flow ratio of 70 SCCM silane to 210 SCCM ammonia in the presence of a nitrogen carrier gas having a 960 SCCM flow level. Maintaining a 0.3 torr pressure in the chamber with 450 Watt/50 KHz RF irradiation yields a silicon nitride layer 9 with a refractive index of 1.93 ±0.03. Refractive index measurements were made using conventional ellipsometry techniques with a helium-neon laser light using a wavelength of approximately 6328 Angstroms. Basically, the silicon nitride passivation layer will be essentially transparent to UV light if it contains minimal excess silicon over stoichiometric silicon nitride level.

In order to erase an EPROM device having a topside passivation layer as described in co-pending application Ser. No. 684,516, UV light 4 from a high-intensity mercury lamp having an emission wavelength of approximately 2537 Angstroms is projected onto the topside of the EPROM integrated circuit 2. Electrons trapped on the floating gate 6 are thereby excited to an extent whereby the migration off the gate 6 "erases" the memory cell, more particularly an array of such cells, within approximately three to thirty minutes.

Hence, a conventionally constructed UV EPROM device 2 having a silicon nitride passivation layer 9 formed thereon in accordance with said method provides an UV erasable integrated circuit memory with all of the advantages of a silicon nitride topside layer.

From the foregoing description of the present invention, the preferred embodiments have been disclosed. It will be obvious to one skilled in the art that the same inventive concept is applicable to other UV erasable memory integrated circuits. It is to be understood that other design variations and modifications are intended to be within the scope of the intended present invention.

What is claimed is:

1. An improved erasable programmable read only memory integrated circuit device comprising a substrate having circuit component means embedded in said substrate, an insulator layer superposed on said substrate, floating gate means within said insulator layer, control gate means within said insulator layer, and a passivation layer superposed on said insulator layer, the improvement characterized by:
  a passivation layer of silicon nitride, having substantially no excess silicon over a stoichiometric silicon nitride level, which is transparent to ultraviolet radiation.

2. The improved integrated circuit device as set forth in claim 1, wherein said passivation layer is substantially transparent to ultraviolet light having a wavelength of approximately 2537 Angstroms.

3. The improved integrated circuit device as set forth in claim 2, wherein the refractive index of said passivation layer is in the range of 1.93±0.03 measured at a wavelength of approximately 6328 Angstroms.

4. The improved integrated circuit device as set forth in claim 3, wherein data stored in said device is erasable within a time period of three to thirty minutes.

5. An improved programmable read only memory integrated circuit device erasable by exposure to ultraviolet light, having a plurality of word lines; a plurality of bit lines; a plurality of memory cell means, each connected to a bit line and a word line, wherein data bits are stored on floating gate means of said memory cell means; and a topside passivation layer means through which ultraviolet light passes in order to erase said memory cell means, the improvement being characterized by:
  said passivation layer comprising a silicon nitride film, having substantially no excess silicon over a stoichiomentric silicon nitride level, which is transparent to ultraviolet radiation.

6. The improved integrated circuit device as set forth in claim 5, wherein said passivation layer is substantially transparent to ultraviolet light having a wavelength of approximately 2537 Angstroms.

7. The improved integrated circuit device as set forth in claim 6, wherein the refractive index of said passivation layer is in the range of 1.93±0.03 measured at a wavelength of approximately 6328 Angstroms.

8. The improved integrated circuit device as set forth in claim 7, wherein data stored in said device is erasable within the time period of three to thirty minutes.

* * * * *